(12) United States Patent
Grodzki et al.

(10) Patent No.: US 10,295,634 B2
(45) Date of Patent: May 21, 2019

(54) METHOD AND APPARATUS CONTROL AND ADJUSTMENT OF PULSE OPTIMIZATION OF A MAGNETIC RESONANCE SYSTEM

(71) Applicant: Siemens Aktiengesellschaft, Munich (DE)

(72) Inventors: David Grodzki, Erlangen (DE); Stephan Stoecker, Baiersdorf (DE)

(73) Assignee: Siemens Aktiengesellschaft, Munich (DE)

( * ) Notice: Subject to any disclaimer, the term of this patent is extended or adjusted under 35 U.S.C. 154(b) by 1127 days.

(21) Appl. No.: 14/627,098

(22) Filed: Feb. 20, 2015

(65) Prior Publication Data
US 2015/0241536 A1    Aug. 27, 2015

(30) Foreign Application Priority Data
Feb. 21, 2014  (DE) .................. 10 2014 203 173

(51) Int. Cl.
*G01R 33/54*     (2006.01)
*G01R 33/385*    (2006.01)

(52) U.S. Cl.
CPC ......... *G01R 33/543* (2013.01); *G01R 33/385* (2013.01); *G01R 33/3854* (2013.01)

(58) Field of Classification Search
CPC . G01R 33/543; G01R 33/385; G01R 33/3854
USPC ................................................ 324/300–322
See application file for complete search history.

(56) References Cited

U.S. PATENT DOCUMENTS

| | | | | |
|---|---|---|---|---|
| 6,418,336 B1 * | 7/2002 | Kimmlingen | ...... | G01R 33/3852 324/318 |
| 6,501,977 B1 * | 12/2002 | Kimmlingen | .......... | A61B 5/055 324/307 |
| 6,687,527 B1 | 2/2004 | Wu et al. | | |
| 2002/0143504 A1 * | 10/2002 | Jensen | .................. | G01R 33/381 703/2 |
| 2008/0154115 A1 * | 6/2008 | Fuderer | .............. | G01R 33/5611 600/410 |
| 2009/0099443 A1 * | 4/2009 | Rahmer | ............. | G01R 33/4824 600/410 |
| 2010/0052678 A1 | 3/2010 | Heid et al. | | |
| 2010/0085048 A1 * | 4/2010 | Bouchard | .............. | G01R 33/48 324/307 |
| 2010/0308829 A1 | 12/2010 | Vu et al. | | |
| 2013/0249549 A1 * | 9/2013 | Pfeuffer | ............. | G01R 33/4833 324/309 |

(Continued)

FOREIGN PATENT DOCUMENTS

| | | | | |
|---|---|---|---|---|
| DE | 102014203173 A1 * | 8/2015 | ........... | G01R 33/385 |
| DE | 102014203173 A1 * | 8/2015 | ........... | G01R 33/385 |

(Continued)

*Primary Examiner* — Patrick Assouad
*Assistant Examiner* — Sean Curtis
(74) *Attorney, Agent, or Firm* — Schiff Hardin LLP

(57) ABSTRACT

In an apparatus and method for pulse optimization adjustment a checking is made as to whether the optimization time resulting from a calculation time for pulse optimization of a pulse sequence section for a modifiable time interval at a predefined gradient grid density, and an associated implementation time, exceeds a real time resulting from the time interval and a buffer time. The gradient grid density for pulse optimization is reduced by a factor f if the optimization time exceeds the real time.

12 Claims, 6 Drawing Sheets

(56) References Cited

U.S. PATENT DOCUMENTS

| | | | | |
|---|---|---|---|---|
| 2014/0232396 | A1* | 8/2014 | Grodzki | G01R 33/543 |
| | | | | 324/309 |
| 2015/0008919 | A1 | 1/2015 | Grodzki et al. | |
| 2015/0234023 | A1* | 8/2015 | Grodzki | G01R 33/482 |
| | | | | 324/309 |
| 2015/0241536 | A1* | 8/2015 | Grodzki | G01R 33/385 |
| | | | | 324/309 |
| 2017/0205477 | A1* | 7/2017 | Grodzki | G01R 33/288 |

FOREIGN PATENT DOCUMENTS

| | | | | |
|---|---|---|---|---|
| DE | 102014203173 | B4 * | 10/2015 | G01R 33/385 |
| DE | 102014203173 | B4 * | 10/2015 | G01R 33/385 |

* cited by examiner

METHOD AND APPARATUS CONTROL AND ADJUSTMENT OF PULSE OPTIMIZATION OF A MAGNETIC RESONANCE SYSTEM

BACKGROUND OF THE INVENTION

Field of the Invention

The invention relates to an apparatus for controlling and adjusting pulse optimization of a magnetic resonance system and to a method for controlling and adjusting pulse optimization of a magnetic resonance system.

The invention further relates to a magnetic resonance system having a radio-frequency transmitting system, having a gradient system and a control device which is designed to control the radio-frequency transmitting system and the gradient system on the basis of a predefined pulse sequence in order to perform a desired scan, and having a pulse sequence optimization device.

Description of the Prior Art

In a magnetic resonance system, also known as a magnetic resonance tomography system, the body to be examined is usually exposed to a relatively high basic magnetic field, e.g. of 1, 3, 5 or 7 teslas, using a main field magnet system. In addition, a gradient system is used to apply a magnetic field gradient. Radio-frequency excitation signals (RF signals) are then emitted via a radio-frequency transmitting system using suitable antenna devices, which is designed to cause the nuclear spins of particular atoms resonantly excited by this radio-frequency field to be tilted by a particular flip angle relative to the lines of force of the main magnetic field. On relaxation of the nuclear spins, radio-frequency signals, so-called magnetic resonance signals, are emitted which are received using suitable receive antennas and then further processed. The desired image data can then be reconstructed from the thus acquired raw data.

For a particular scan, a particular pulse sequence must therefore be emitted which consists of a string of radio-frequency pulses, in particular excitation pulses and refocusing pulses as well as gradient pulses to be emitted in an appropriately coordinated manner in different spatial directions. Suitably timed readout windows must be set which predefine the time segments in which the induced magnetic resonance signals are acquired. For imaging, the timing within the sequence is critical, i.e. what pulses follow one another at what time spacings. A large number of the control parameters are generally defined in a so-called scan protocol which is created in advance and called up e.g. from a memory for a particular scan and can in some cases be changed locally by the operator who can specify additional control parameters such as e.g. a particular inter-slice separation of a stack of slices to be scanned, a slice thickness, etc. A pulse sequence, which is also termed a scanning sequence, is then calculated on the basis of all these control parameters.

The gradient pulses are defined by their gradient amplitude, the gradient pulse duration and by the rate of change or rather the $1^{st}$ derivative of the pulse shape dG/dt of the gradient pulses, usually also termed the slew rate. Another important gradient pulse variant is the gradient pulse moment (also called "moment" for short) which is defined by the integral of the gradient amplitude over time.

During a pulse sequence, the magnetic gradient coils via which the gradient pulses are emitted are switched frequently and rapidly. As the timing within a pulse sequence is mostly very strict and, in addition, the total duration of a pulse sequence which determines the total duration of an MRI scan must be minimized as far as possible, gradient strengths of around 40 mT/m and slew rates of up to 200 mT/m/ms are to be reached. In particular, such a high slew rate contributes to the well-known acoustic noise occurring during gradient switching. Eddy currents associated with other components of the magnetic resonance system, in particular the radio-frequency shield, are one reason for these noise problems. In addition, steep edges of the gradients result in a higher energy consumption and also place more exacting requirements on the gradient coils and the other hardware. The rapidly changing gradient fields result in distortions and oscillations in the gradient coils and transmission of these energies to the housing. Heating of the coils and the other components may also cause high helium boil-off.

In order to reduce the noise levels, various hardware design solutions have been proposed, such as e.g. encapsulation or vacuum sealing of the gradient coils.

In DE 10 2013 202 559, corresponding to US 2014/0232396, a method is described in which a prepared pulse sequence, which is to be sent to the scanner of the magnetic resonance system, is analyzed in order to determine a time interval, i.e. a pulse block section within the pulse sequence, which is to be optimized with respect to a gradient waveform, or more specifically a gradient pulse. In a first step, all the original commands that are sent to the scanner are intercepted, then in a second step they are first examined for optimizable segments therein, in a third step these segments are optimized, and not until a fourth step is the optimized pulse sequence forwarded to the scanner. There, the optimization preferably takes place using spline interpolation that satisfies particular constraints including a gradient moment, and in an amplitude at predefined nodes, in particular at a start time of the respective interval and at an end time of the respective interval. Spline interpolation produces a maximally smooth gradient waveform with rounded edges. The calculation of such a spline interpolation is relatively time-consuming particularly in the case of longer gradient intervals, possibly resulting in the scan being aborted if only a small amount of time is available for optimization. This can be problematic particularly for real-time applications.

The first two of the aforementioned steps require only a negligibly small amount of computing time. However, step III (optimization) and step IV (forwarding to the scanner and internal implementation) may involve lengthy calculation times. In the case of real-time applications, or in the case of protocols having very short repetition times, this can result in scans being aborted if the calculation time of the optimization unit and the required implementation time relating to the above mentioned fourth step become greater than a real time need and a small buffer, so the commands cannot be provided at the required real time.

It is possible to reduce the calculation time of the optimized gradient waveforms by ensuring that each waveform is only calculated once, and is reused from then on in each repetition. A linear waveform can also be calculated instead of a fourth order spline. However, the time which is required in the fourth step described above for the provision and internal implementation of the commands does not change as a result of said methods. This calculation time depends on the size of the objects in the transmitted event blocks. Because of the high gradient sampling rates, the gradient commands are critical here for the time duration for the fourth step.

SUMMARY OF THE INVENTION

An object of the present invention is to provide a solution to the problem of scans being aborted when pulse optimization methods are used as real-time applications.

The apparatus according to the invention has a checking unit for verifying whether the optimization time resulting from a calculation time for pulse optimization of a pulse sequence section for a modifiable time interval at a predefined gradient grid density and the associated implementation time exceeds a real time resulting from the modifiable time interval and a buffer time.

In the following, the gradient grid density includes not only the node density, i.e. the grid density with which the optimized pulse sequence sections are calculated, but also the grid density with which the pulse sequence sections are forwarded to the MR scanner in a fourth step.

A pulse sequence section includes, for example, one or more pulses, e.g. gradient pulses.

A modifiable time interval is a section of a pulse sequence, i.e. a pulse sequence section, which is a candidate for the above described spline method or another modification method.

In addition, the apparatus has a reduction unit designed to reduce the gradient grid density for pulse optimization by a factor f if the optimization time exceeds real time.

The inventive magnetic resonance system incorporates the apparatus according to the invention.

In the inventive method, it is checked whether the optimization time resulting from the calculation time for pulse optimization of a pulse sequence section for a modifiable time interval at a predefined gradient grid density and the associated implementation time exceeds a real time resulting from the time interval and a buffer time.

In addition, the gradient grid density predefined for pulse optimization is reduced by a factor f depending on the result of the check if the optimization time exceeds real time.

The invention also comprises a non-transitory, computer-readable data storage medium that can be loaded directly into a memory of the apparatus according to the invention, having program code that cause all the steps of the method according to the invention to be executed in the apparatus according to the invention. The advantage of such a software realization is that, by implementation of the program, existing control devices of magnetic resonance systems can be suitably modified in order to check and adjust pulse sequences in the inventive manner, e.g. with the benefit of the above mentioned advantages.

In one embodiment of the invention, the apparatus can be designed to transmit the pulse sequence, not to a pulse shape optimization unit, but directly to a pulse transmitting arrangement if reducing the gradient grid density does not result in a sufficient reduction in computing time.

In this case, if the time available for pulse optimization is insufficient, the pulse optimization step is bypassed. The pulse sequence optimization device, i.e. the pulse shape optimization unit, can therefore be switched "passive" if reducing the gradient grid density does not deliver the required computing time saving. In this case, all the commands are forwarded directly to the MR scanner without being optimized or modified by the pulse shape optimization unit. As a result, the computing time of the pulse sequence optimization unit falls to zero so that a scan abort can be prevented.

According to the invention, the pulse optimization variants mentioned are handled flexibly depending on the optimization time and the available real time.

In addition, the reduction unit can be designed to reduce the gradient grid density by a factor f as a function of a predetermined minimum gradient grid density.

According to this aspect, the user can influence the "strength" or rather "quality" of the pulse sequence optimization. For example, the user can select the percentage which predefines the accuracy or density of the grid points. In this case, a scan abort would only occur if the percentage selected were too high for sufficient computing time minimization. The user therefore influences the "quality" of the pulse optimization as well as the risk of a scan abort.

Alternatively, the gradient grid density can also include the grid density with which the pulse sequence sections are forwarded to the MR scanner in a fourth step.

For example, the calculation of the optimized gradient pulses or rather pulse sequence sections can therefore be carried out with an unchanged grid density, whereas the grid density with which the pulse sequence sections are forwarded to the MR scanner in a fourth step is also reduced in this embodiment in order to reduce the time which is required for the fourth step, i.e. for the forwarding of the optimized pulse sequence sections to the MR scanner.

In the event that the required time for pulse optimization using the predetermined minimum gradient grid density is longer than the real time of the application, a scan abort can also be performed.

The apparatus according to the invention can be designed to perform a scan abort if the required time for pulse optimization using a predetermined minimum gradient grid density exceeds the real time of the application.

The reduction unit can be designed to interpolate the gradient pulses linearly.

Alternatively, the reduction unit can be designed to interpolate the gradient pulses nonlinearly.

As described in DE 10 2013 202 559, basically any optimization criteria can also be predefined for the optimizable time intervals. As mentioned, however, such optimization techniques generally require somewhat more computing time. In the method according to the invention, with particular preference an optimization time available for defining the gradient waveform is therefore first determined for a particular (currently) to be modified time interval. Depending on this, it is then first decided whether to define the gradient waveform in the modifiable time interval using the method according to the invention by carrying out a spline interpolation technique using a particular gradient density, or whether the gradient waveform shall remain unchanged. The spline interpolation technique is preferably a 4th or 5th order interpolation method. According to this decision, modification of the gradient waveform is carried out, i.e. optimization takes place in accordance with the predefined optimization criterion, e.g. using the spline interpolation method, or, if the optimization time available is too short, e.g. is below a limit value, no optimization is performed.

If the optimization time is sufficient, basically any optimization criteria can be predefined. In this connection reference is again made to DE 10 2013 202 559 whose content in respect of the different optimization criteria and optimization techniques, particularly spline interpolation, is hereby fully incorporated.

Also in the method according to the invention, the pulse characteristics are optimized separately in the individual gradient directions, i.e. the pulse shape or rather the gradient waveform is considered and optimized separately in each gradient direction, e.g. x-, y-, z-direction, i.e. slice selection direction, phase encoding direction and readout direction respectively.

As in DE 10 2013 202 559, the present invention likewise also provides the possibility of across-the-board pulse optimization.

If for any reason the system specification parameters are not met, e.g. the maximum permissible gradient amplitude and/or the maximum permissible slew rate are exceeded, the optimized pulse shape cannot be used. In this case the pulse shape is again preferably replaced in the time interval by the original pulse shape.

In another preferred variant, in order to accelerate the method, prior to optimization of a time interval it can also first be checked whether the required gradient waveform has already been calculated once before. In many sequences, a relatively high number of repetitions of identical sequence sections is required. In this case, required gradient waveforms repeatedly occur. In these cases, recalculation can be dispensed with by simply storing the optimized gradient waveforms with appropriate identification means and then retrieving them again. For example, gradient waveforms already calculated for particular constraints can be reused if it is a matter of regenerating an optimized gradient waveform for the same constraints. Such a method is described, for example, in DE 10 2013 213 255.

In addition to the advantages of the publications cited, the method according to the invention now additionally offers the advantage of calculating a new gradient waveform adjusted to the respective timing. In particular, real-time use is facilitated by the faster calculation and implementation of the pulse sequences.

DESCRIPTION OF THE PREFERRED EMBODIMENTS

The invention will now be described using the example of an implementation in the pulse sequence optimization device or more specifically use within the optimization method as described in detail in DE 10 2013 202 559. However, it is expressly pointed out at this juncture that the invention can also be used in another form, e.g. directly for pulse design or in the original calculation or preparation of the pulse sequence.

Figure 1:
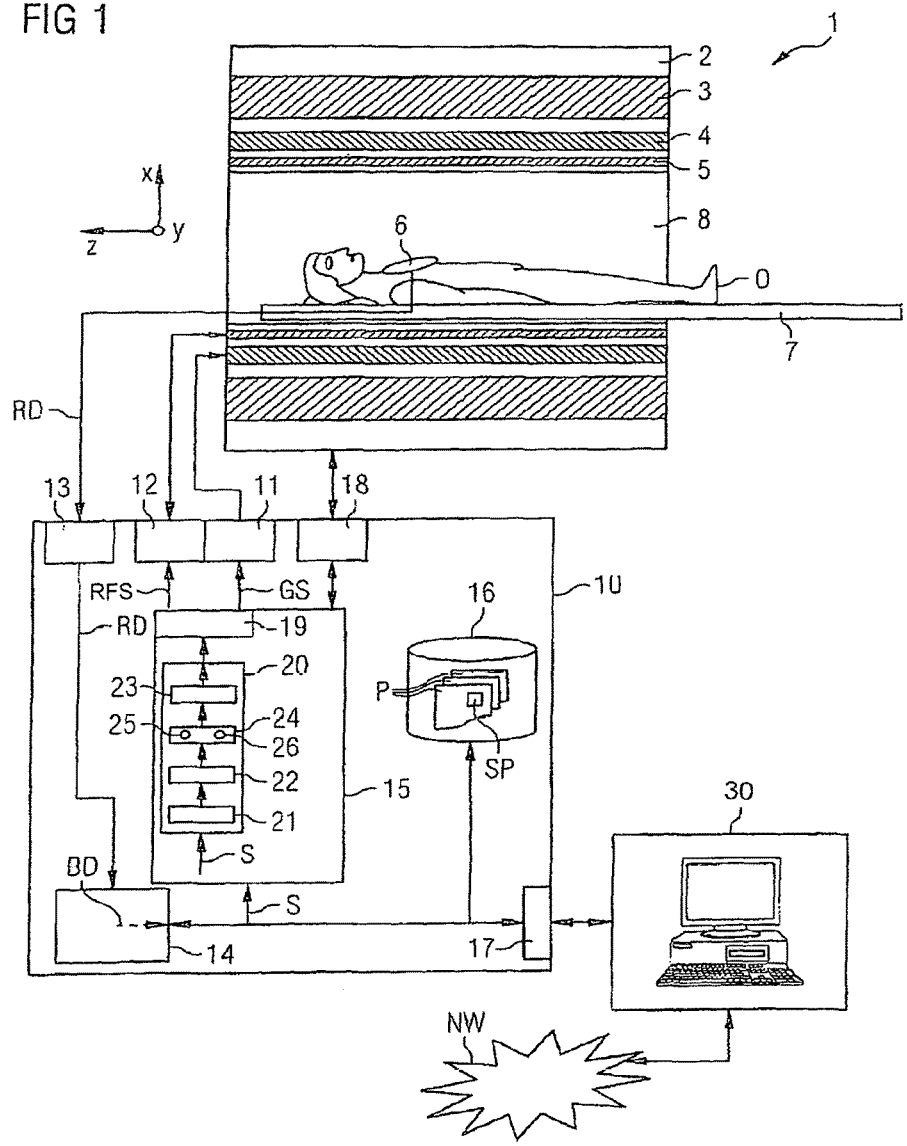
FIG. 1 schematically illustrates an example of an apparatus according to an exemplary embodiment of the invention.

FIG. 1 shows a grossly schematic representation of an inventively designed magnetic resonance system 1. It includes the actual magnetic resonance scanner 2 surrounding a scanning bore or patient tunnel 8. A bed 7 can be slid into the patient tunnel 8 so that a patient O or examination subject thereon can be placed in a particular position within the magnetic resonance scanner 2 relative to a magnet system and radio-frequency system disposed therein during an examination or can also be moved between different positions during a scan.

Basic components of a magnetic resonance scanner are a main field magnet 3, a gradient system 4 having magnetic field gradient coils for generating magnetic field gradients in the x-, y- and z-directions and a radio-frequency body coil 5. These components are commonly referred to collectively as forming a magnetic resonance scanner. The magnetic field gradient coils in the x-, y- and z-direction can be controlled independently of one another so that, by a predefined combination, gradients can be applied in any spatial directions (e.g. in the slice selection direction, in the phase encoding direction or in the readout direction), wherein these directions generally depend on the slice orientation selected. The spatial directions can likewise also coincide with the x-, y- and z-directions, e.g. the slice selection direction in the z-direction, the phase encoding direction in the y-direction, and the readout direction in the x-direction. Magnetic resonance signals induced in the examination object O can be received via the body coil 5 which can generally also be used to emit the radio-frequency signals for inducing the magnetic resonance signals. However, these signals are usually received using a local coil arrangement 6 composed of e.g. local coils (of which only one is shown) placed on or under the patient O. All these components will be familiar to the average person skilled in the art and are therefore represented only in a grossly schematic manner in FIG. 1.

The components of the magnetic resonance scanner 2 are controlled by a control computer 10. This can be a control computer which can also consist of a plurality of individual computers—possibly also spatially separated and interconnected by suitable cables or the like. This control computer 10 is connected via a terminal interface 17 to a terminal 30 from which an operator can control the entire system 1. In this case, the terminal 30 is implemented as a computer equipped with a keyboard, one or more screens and other input devices such as a mouse or the like, so as to provide the operator with a graphical user interface.

The control computer 10 has among other things a gradient control unit 11 which can in turn be composed of multiple subcomponents. The individual gradient pulses are switched according to a gradient pulse sequence GS using control signals from said gradient control processor 11. As described above, these are gradient pulses that are set (output) during a scan at precisely intended positions in time and with a precisely predefined time characteristic.

The control computer 10 also has a radio-frequency transmit unit 12 for injecting radio-frequency pulses into the radio-frequency body coil 5 according to a predefined radio-frequency pulse sequence RFS of the pulse sequence MS. The radio-frequency pulse sequence RFS includes the above described excitation and refocusing pulses. The magnetic resonance signals are then received using the local coil arrangement 6, and the raw data RD received therefrom is read out and processed by an RF receive unit 13. The magnetic resonance data is transferred in digital form as raw data RD to a reconstruction unit 14 which reconstructs the image data BD therefrom and stores it in a memory 16 and/or transfers it via the interface 17 to the terminal 30 so that the operator can view it. The image data BD can also be stored and/or displayed and evaluated elsewhere via a network NW. Alternatively, a radio-frequency pulse sequence can also be emitted via the local coil arrangement and/or the magnetic resonance signals can be received by the radio-frequency body coil (not shown) depending on the current configuration of the radio-frequency body coil 5 and the coil arrangement 6 including the radio-frequency transmit unit 12 or RF receive unit 13 as the case may be.

Via another interface 18, control commands are transmitted to other components of the magnetic resonance scanner 2, such as e.g. the couch 7 or the main field magnet 3, or measured values or other items of information are received.

The gradient control unit 11, the RF transmit unit 12 and the RF receive unit 13 are coordinated in each case by a scan controller 15. This ensures by appropriate commands that the desired gradient pulse sequences GS and radio-frequency pulse sequences RFS are emitted. In addition, it must be ensured that the magnetic resonance signals are read out from the local coils of the local coil arrangement 6 and further processed by the RF receive unit 13 at the appropriate time. The scan controller 15 likewise controls the interface 18. The scan controller 15 can be, for example, a processor or multiple interacting processors. An inventive pulse sequence optimization device 20 which will be explained in greater detail below can be implemented thereon, e.g. in the form of suitable software components.

The basic functioning of such a magnetic resonance scan and the control components mentioned (apart from the pulse sequence optimization device 20 specially implemented herein) are familiar to those skilled in the art, and thus need not be discussed in further detail herein. Moreover, a magnetic resonance scanner 2 of this type and the associated control computer can have a number of other components that likewise need not be explained in detail herein. It is noted that the magnetic resonance scanner 2 can be of different basic design, e.g. having a patient receptacle that is open to the side, or can be implemented as a smaller scanner in which only a body part can be positioned.

In order to start a scan, the operator can usually select, via the terminal 30, a control protocol P provided for that scan from a memory 16 in which a number of control protocols P for different scans are stored. This control protocol P contains, among other things, various control parameters SP for the respective scan. These control parameters SP include particular basic requirements for the desired pulse sequence, e.g. the sequence type, i.e. whether it is a spin echo sequence, a turbo spin echo sequence, etc. Also included are control parameters that define the magnetizations to be achieved by the individual radio-frequency pulses, requirements concerning a k-space trajectory to be traversed to acquire raw data and, in addition, slice thicknesses, inter-slice separations, number of slices, resolution, repetition times, the echo times in a spin echo sequence, etc.

The terminal 30 allows the user to change some of these control parameters in order to create an individual control protocol for a currently desired scan. For this purpose modifiable control parameters can be displayed for modification on a graphical user interface of the terminal 30.

Otherwise the user can also call up control protocols, e.g. of the manufacturer of the magnetic resonance system, via a network NW and then modify or use them as required.

Based on the control parameters SP, a pulse sequence S or scan sequence is determined that the scan controller 15 will ultimately use to control the other components. The pulse sequence S can be calculated or designed in a pulse sequence determining device that can be implemented e.g. in the form of software components on the computer of the terminal 30. In principle, however, the pulse sequence determining device can also be part of the control computer 10 itself, in particular of the scan controller 15. However, the pulse sequence determining device could also be implemented on a separate computing system which is connected to the magnetic resonance system e.g. via the network NW.

For processing a pulse sequence S, it is first optimized in the inventive manner by the scan controller 15 in a pulse sequence optimization device 20 before being fed via a pulse transmitting arrangement 19 of the scan controller 15 which finally transfers the radio-frequency pulse sequence RFS to the RF transmit unit 12 and the gradient pulse sequence GS to the gradient control unit 11. For this purpose the pulse sequence optimization device 20 contains an input interface 21 for receiving the actually prepared emission-ready but not yet optimized pulse sequence S and transfers it to an analyzer unit 22 that performs computerized analysis of the pulse sequence to identify fixed-point time segments and modifiable time intervals which may be optimized. This analyzer unit 22 includes, for example, the time interval determining unit 22 for determining a time interval to be optimized in respect of a gradient waveform.

In a pulse shape optimization unit 23, the pulse shape of the gradient pulses in the modifiable time intervals is optimized. This can basically take place as in DE 10 2013 202 559 with respect to any predefined optimization criterion, particularly, for example, with respect to the $1^{st}$ derivative of the gradient waveform, in order to achieve noise reduction. For example, various optimization criteria can be specified by an operator via the terminal 30 and/or stored in a memory. In the present case the pulse sequence optimization device 20 inventively additionally comprises an adjustment and control unit 24. The adjustment and control unit has a checking unit 25 that checks whether the optimization time resulting from the calculation time for pulse optimization of a pulse sequence section for a modifiable time interval $I_0$ at a predefined gradient grid density and the associated implementation time exceeds a real time resulting from the time interval ($I_0$) and a buffer time. The adjustment and control unit 24 additionally has a reduction unit 26 designed to reduce the gradient grid density for pulse optimization by a factor f if the optimization time exceeds real-time.

The apparatus according to the invention can alternatively be part of the pulse shape optimization unit 23.

The detailed manner of operation of these components will now be described with reference to FIGS. 2 to 6 using the example of generation and further processing of a pulse sequence S.

The method shown in FIG. 2 for generating and optimizing pulse sequences essentially corresponds to the method preferably used in DE 10 2013 202 559, except that in step IVb additional checking and adjustment steps are now carried out, as will be explained in more detail below.

Figure 2:
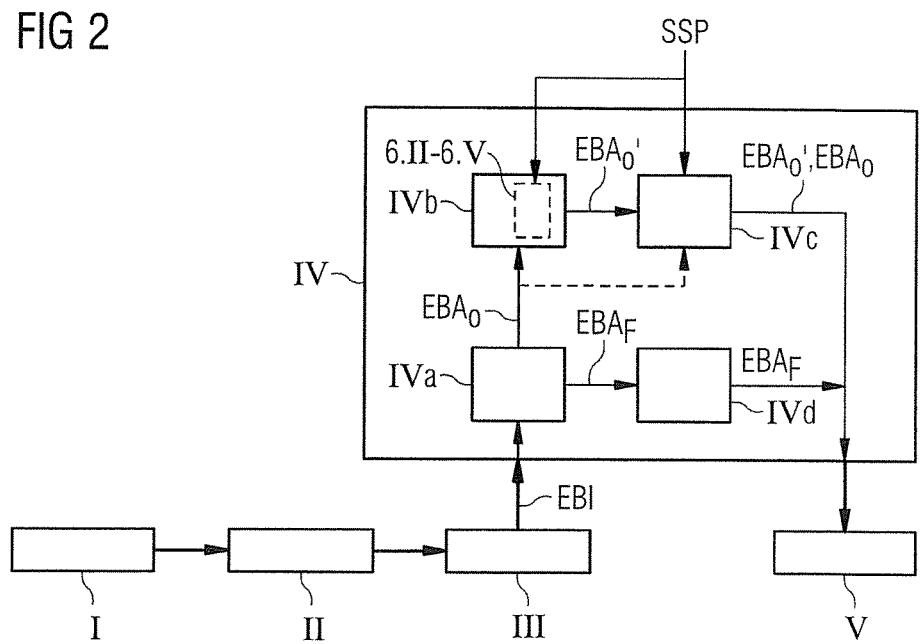
FIG. 2 is a flowchart of an exemplary embodiment of an optimization technique using the invention.

As shown in FIG. 2, the method begins in step I starting in the normal manner with preparation of the pulse sequence S. This is to say, among other things the sequence type is specified or rather a corresponding protocol is selected in which a particular sequence type is defined. The required parameters or possibly also modifications to these parameters are applied by the user. In a step II, the precise timing and progression of the pulse sequence is calculated using the predefined sequence parameters. In step III the emission-ready but not yet optimized pulse sequence is transferred in the form of event blocks. Without using pulse sequence optimization and the method according to the invention, in step III the event blocks could be transferred directly to the pulse transmitting arrangement 19 which then, in step V, outputs the event blocks and thus ensures that the entire pulse sequence S is executed. For pulse optimization, however, processing of the individual event blocks takes place prior to forwarding of the event blocks in step IV. As the execution of the pulse sequence S takes place sequentially in steps II, III, IV and V in the form of individual event blocks, these steps can accordingly take place in a chronologically parallel manner, i.e. later event blocks are still in step II while earlier event blocks are already being transferred to the pulse transmitting arrangement 19 in step V.

Figure 3:
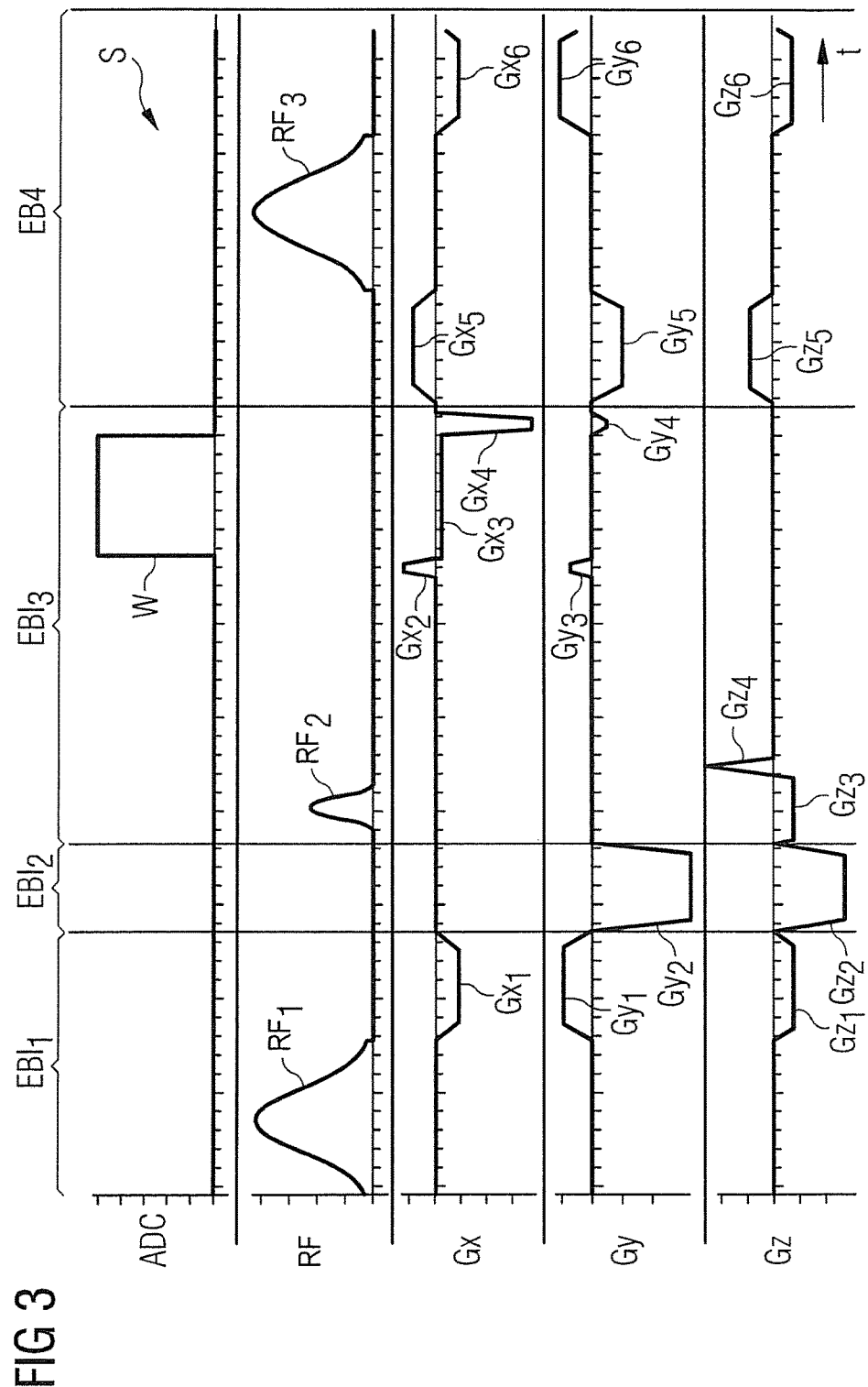
FIG. 3 shows a typical pulse sequence to which the method according to the invention can be applied, subdivided into individual event blocks.

As an example, FIG. 3 shows a pulse diagram of the first part of a greatly simplified gradient echo sequence which is subdivided into event blocks $EBI_1$, $EBI_2$, $EBI_3$, $EBI_4$ (in FIG. 3 only the first three event blocks are shown fully and the fourth almost fully). This pulse diagram shows the readout windows W, the radio-frequency pulses $RF_1$, $RF_2$, $RF_3$ and the gradient pulses as a function of time t in the normal manner on different time axes one above the other. The readout window W is shown on the topmost readout time axis ADC, and the amplitudes of the radio-frequency pulses $RF_1$, $RF_2$, $RF_3$ to be emitted are shown below it on the radio-frequency pulse time axis RF. Shown below that on the gradient pulse time axis Gx are the gradient pulses $Gx_1$, $Gx_2$, $Gx_3$, $Gx_4$, $Gx_5$, $Gx_6$. These are the gradient pulses in the readout direction. Shown below that on the gradient pulse time axis Gy are the gradient pulses $Gy_1$, $Gy_2$, $Gy_3$, $Gy_4$, $Gy_5$, $Gy_6$ which are switched in the phase encoding direction, and on the lowest gradient pulse axis Gz the gradient pulses $Gz_1$, $Gz_2$, $Gz_3$, $Gz_4$, $Gz_5$, $Gz_6$ in the slice selection direction. The position of the time axis defines the zero line, i.e. in the case of the gradients the pulses can be negative or positive gradient pulses depending on whether their amplitudes extend below or above the gradient pulse time axis Gx, Gy, Gz. In all the pulse diagrams, for simplification, the scaling in the time direction and in the amplitude direction is only in arbitrary units, as primarily only the comparison of the pulse waveforms or shapes before and after optimization is relevant for understanding the inventive principle.

The first event block $EBI_1$ of this pulse sequence S is an event block $EBI_1$ which is designed to cause fat saturation. Therefore a relatively powerful radio-frequency pulse $RF_1$ is first emitted, during which no gradient pulse is output, so that the radio-frequency pulse $RF_1$ does not have a slice selective effect. However, the radio-frequency pulse $RF_1$ is immediately followed by three gradient pulses $Gx_1$, $Gy_1$, $Gz_1$ in all three spatial axes, which are used to dephase transverse magnetization unintentionally produced by the fat saturation.

The next event block $EBI_2$ is used as a pre-spoiler. In this event block $EBI_2$ two negative gradient pulses $Gy_2$, $Gz_2$ are switched in the y- and z-direction. These pulses are also used to effectively dephase any residual transverse magnetizations that may have been generated or refocused by the preceding excitations.

The third event block $EBI_3$ contains a gradient echo sequence in which magnetic resonance signals are acquired in a particular volume or more specifically a particular slice by exciting the volume by a radio-frequency pulse $RF_2$ while simultaneously activating a defined gradient $Gz_3$ in the slice selection direction Gz and then setting a readout window W while switching a particular gradient $Gx_3$ in the readout direction Gx, i.e. the ADC is switched to receive. In this event block $EBI_3$ there are other gradient pulses $Gz_4$, $Gx_2$, $Gy_3$, $Gx_4$, $Gy_4$, which are used to dephase the magnetization generated by the excitation pulse in order not to generate any unwanted echoes in the subsequent event blocks.

This gradient echo event block $EBI_3$ is then followed by another fat saturation event block $EBI_4$ which begins with three gradient pulses $Gx_5$, $Gy_5$, $Gz_5$ being switched in parallel in the x-, y- and z-direction, then a non-slice-selective radio-frequency pulse $RF_3$ is emitted, wherein all the gradients are nulled and then other gradient pulses $Gx_6$, $Gy_6$, $Gz_6$ are emitted again in all three spatial directions. This can be followed by other event blocks, e.g. another pre-spoiler, another repetition, a gradient echo event block, etc.

Each of these event blocks $EBI_1$, $EBI_2$, $EBI_3$, $EBI_4$ contains—as can be clearly seen—time segments that would basically be optimizable. These are here the time segments which do not fall within the above described criteria of, for example, being gradients that are emitted in parallel with one of the radio-frequency pulses $RF_1$, $RF_2$, $RF_3$ or the readout window W. Primarily non-modifiable gradient pulses, such as flow compensation gradient pulses, fusion gradient pulses or alerting gradient pulses, are the type of pulses not included in the simplified sequence shown here.

Apart from the pre-spoiler event block $EBI_2$, all the other event blocks $EBI_1$, $EBI_3$, $EBI_4$ also contain fixed-point time segments in which no modification of the gradient amplitude values is permitted and which must therefore be excluded from any optimization. Therefore, as shown in FIG. 2, within method step IV the incoming event blocks EBI are first checked in a first method sub-step IVa to ascertain where the non-modifiable fixed-point time segments lie and where the modifiable, i.e. optimizable, time intervals lie. A re-subdivision of the pulse sequence S into outgoing event blocks $EBA_F$, $EBA_O$ also takes place in this step IVa.

Figure 4:
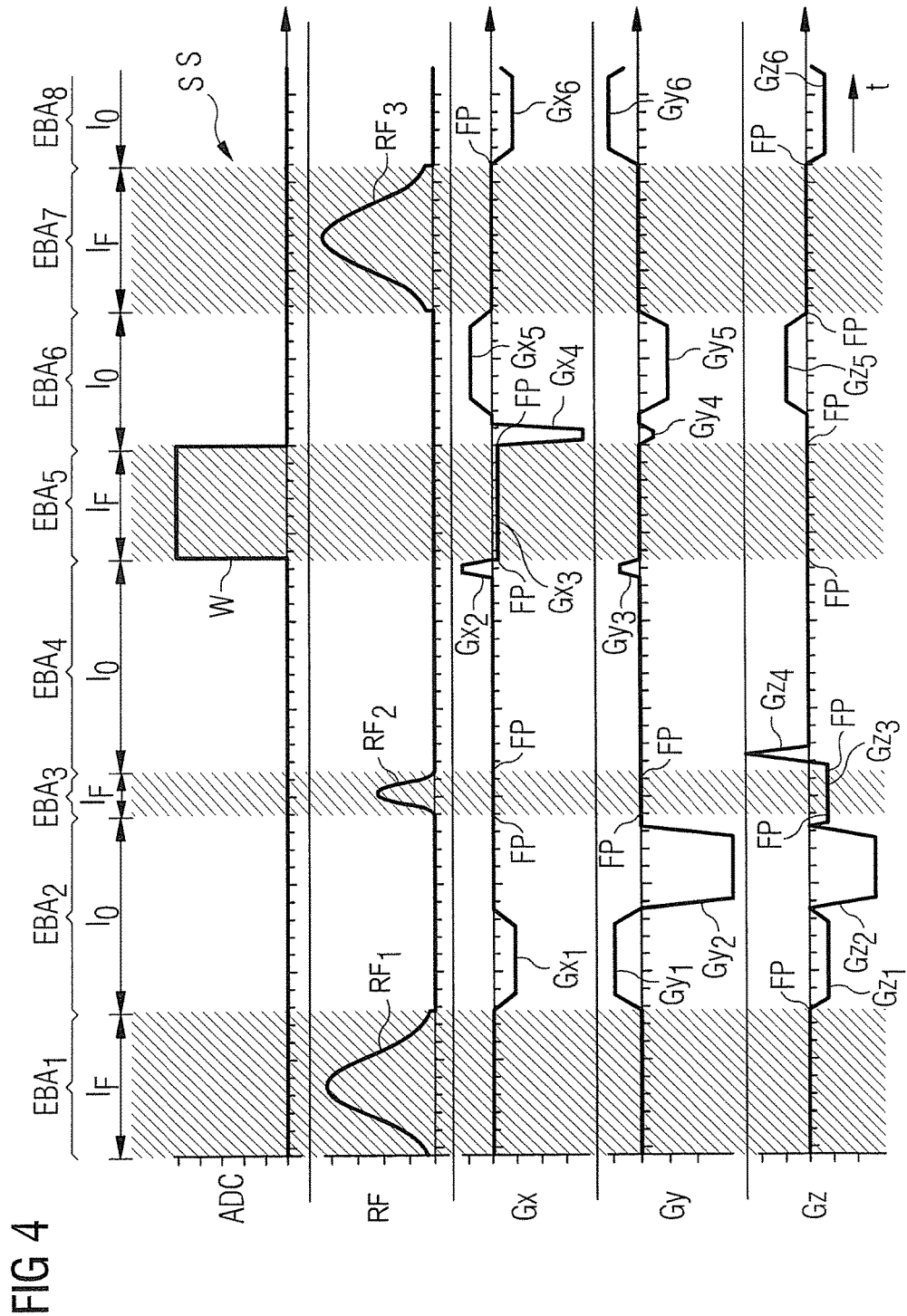
FIG. 4 shows the pulse sequence according to FIG. 3, subdivided into outgoing non-modifiable event blocks which contain a fixed point time segment, and optimizable event blocks which contain a modifiable time interval.

This is illustrated in FIG. 4 for the pulse sequence S from FIG. 3. Here the non-optimizable fixed-point time segments $I_F$ are covered in each case by a crosshatched pattern and the optimizable time intervals $I_O$ are not covered. This automatically produces new outgoing event blocks $EBA_1$, $EBA_2$, . . . , $EBA_8$, wherein these outgoing event blocks $EBA_1$, $EBA_2$, . . . , $EBA_8$ contain either one fixed-point time segment $I_F$ or one optimizable time interval $I_O$ in each case. Identified here as non-optimizable time segments $I_F$ are those time segments in which the radio-frequency pulses $RF_1$, $RF_2$, $RF_3$ are emitted in parallel or the readout window W is switched. In these periods, the gradients must remain on the exactly predefined amplitude values. In the intervening periods, the pulse shapes, i.e. the gradient waveform, may be varied as required within certain constraints, e.g. that the amplitude values are retained at the boundary points with the adjacent event blocks, that the length of the time interval $I_O$ remains unchanged and that the total moment of the gradient pulses in the respective optimizable time segments $I_O$ is the same before and after optimization. In another step IVb, the optimizable event blocks $EBA_2$, $EBA_4$, $EBA_6$, $EBA_8$ are then optimized subject to the above mentioned constraints (in FIG. 2 these optimizable event blocks are denoted as a whole by the reference character $EBA_O$).

Figure 5:
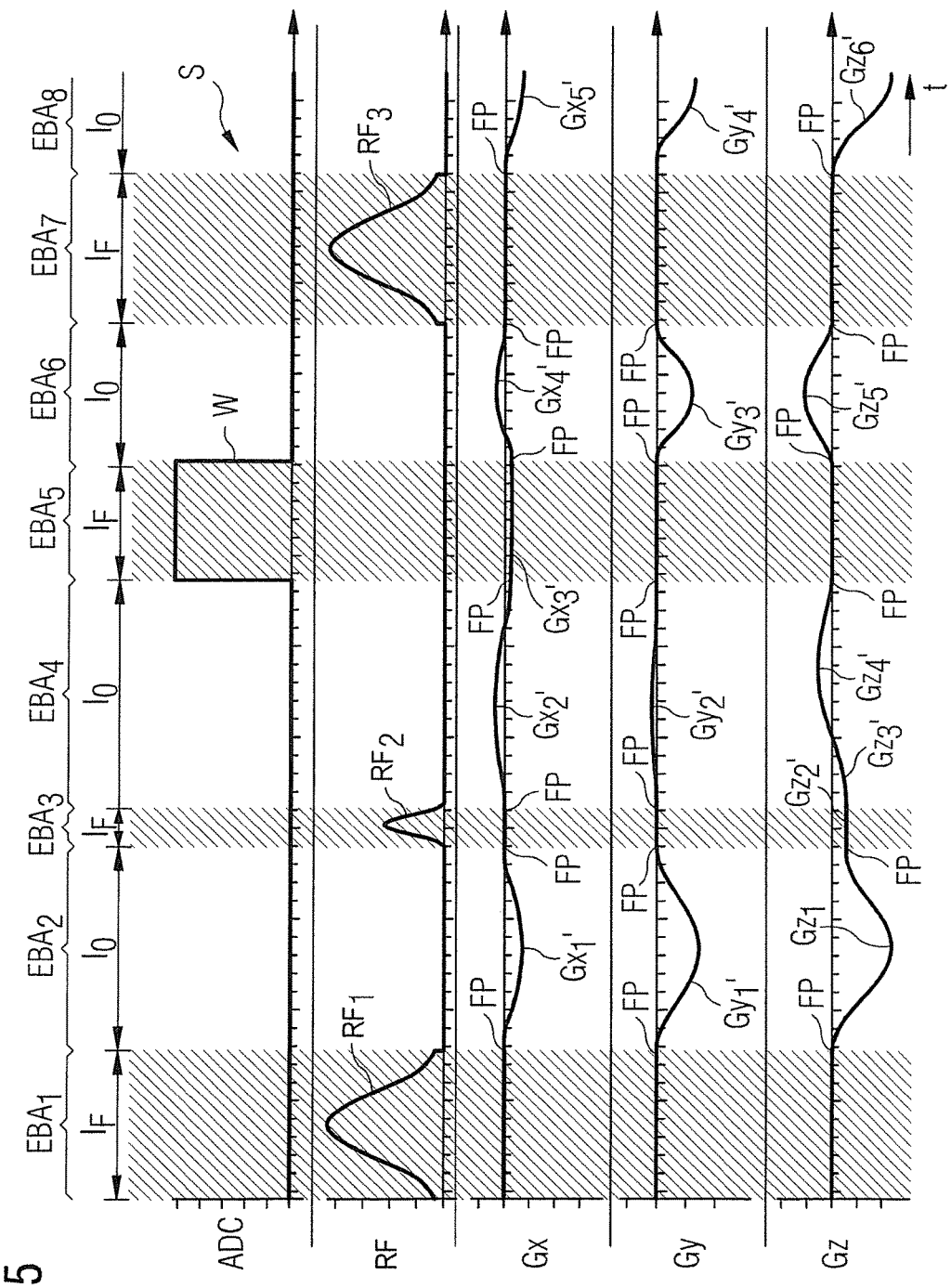
FIG. 5 shows the pulse sequence according to FIG. 4 after optimization of the optimizable event blocks by means of spline interpolation.

The optimization in step IVb then may take place using the spline interpolation techniques, as explained in DE 10 2013 202 559, wherein the start and end points at the boundaries of the respective time interval $I_O$ are each regarded as fixed points FP and a spline results in a desired smooth pulse shape in the respective optimizable time segments $I_O$, subject to predefined constraints (reaching of the fixed points, maintaining of the integral below the curve, retaining of the length of the time interval $I_O$, and additionally setting of the $1^{st}$ derivative at the fixed points=0). Calculation of the splines is performed using a predefined gridding, i.e. a particular increment, wherein the splines are interpolated between the grid points. However, as is explained in more detail with reference to FIG. 6, in step IVb additional checking and possibly additional calculation steps are carried out in which spline interpolation is possibly performed using a lower grid density or is omitted completely. Were it to become apparent from these additional checking steps that spline interpolation can be performed for optimization in all the time intervals $I_O$ of the pulse sequence from FIG. 4, the pulse sequence according to FIG. 5 would result following optimization. FIG. 5 shows particularly well how adjacent, relatively angular steep-sided pulses have been converted into gradient pulses $Gx_1'$, $Gx_2'$, $Gx_3'$, $Gx_4'$, $Gx_5'$, $Gy_1'$, $Gy_2'$, $Gy_3'$, $Gy_4'$, $Gz_1$ $Gz_2'$, $Gz_3'$, $Gz_4'$, $Gz_5'$, $Gz_6'$ having in some cases merging common pulse shapes that are relatively smooth and therefore place much less load on the gradient coils and therefore significantly reduce noise levels.

Figure 6:
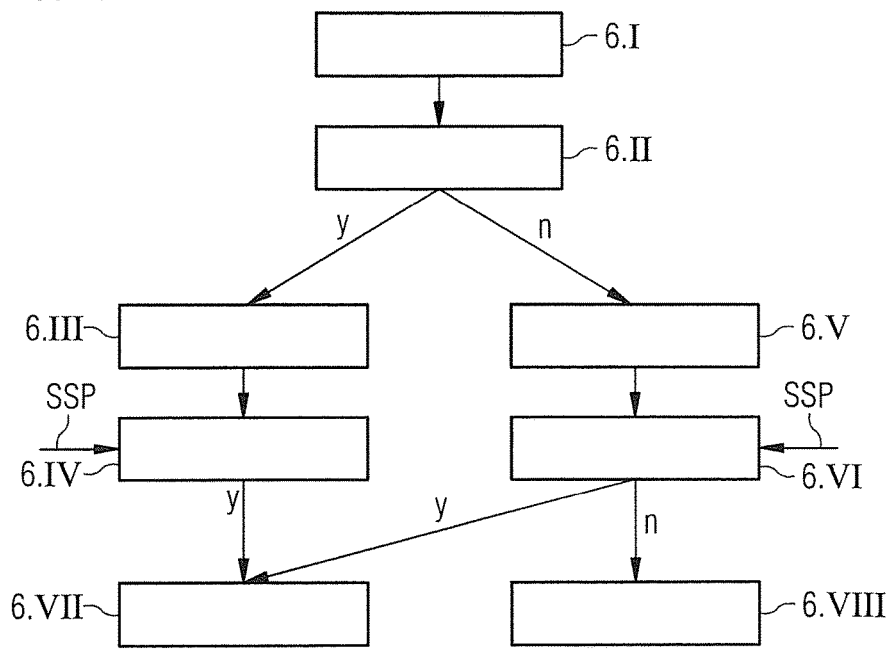
FIG. 6 is a flowchart of an exemplary embodiment of the method according to the invention, e.g. for use in the technique according to FIG. 2.

However, as mentioned, a disadvantage of spline interpolation is that it requires a relatively large amount of computing time. For this reason, the additional method steps 6.II to 6.V are now carried out in step IVb, as explained with reference to FIG. 6. In FIG. 6 the entire procedure is described once again, beginning with a step 6.I in which first an optimizable time interval $I_O$ within the pulse sequence is determined. This corresponds essentially to step IVa in FIG. 2. Within step IVb in FIG. 2 the duration of the time interval $I_O$ is then first determined in step 6.II according to FIG. 6. In this step it is also checked whether sufficient optimization time is available in order to be able to carry out spline interpolation with the predefined optimization time.

If this is the case (branch "y"), the spline waveform is calculated in step 6.III in the conventional manner using the predefined grid density, wherein the first derivatives of the boundary values are set to zero as additional constraints. This method therefore proceeds as in DE 10 2013 202 559. In a subsequent step 6.IV, the calculated spline waveform is first checked to ascertain whether particular system-specific parameters SSP are met. In particular it is checked whether the maximum permissible gradient amplitude and the maximum permissible slew rate are complied with. If this is the case (branch "y"), in step 6.VII the optimized waveform can be forwarded directly to the scanner, i.e. the event block $EBA_O$ can be transferred. This already corresponds to method step V in FIG. 2.

In this case, method step IVc in FIG. 2 is superfluous.

If it is established in step 6.II that the optimization time is insufficient for calculating a spline waveform using the predefined grid density (branch "n" starting from step 6.II), in step 6.V the gradient grid density for pulse optimization is reduced by a factor f so that the optimization time of the event block no longer exceeds the real time assigned to the event block. The spline waveform is then calculated using the changed grid density. The shape of the gradient is barely changed by a grid density reduced e.g. by one order of magnitude. The amplitude and slew rate remain unchanged.

In a further step 6.VI, the gradient waveform in the time interval $I_O$, i.e. the prepared optimized event block $EBA_O$, can be checked once again to ascertain whether the system specific parameters SSP are also actually met. This basically corresponds to step IVc in FIG. 2.

If this is not the case (branch "n" of step 6.VI), the optimized event block $EBA_O'$ is again replaced by the original event block $EBA_O$, as indicated by the dashed line in FIG. 2 and as represented in FIG. 6 by step 6.VIII. However, it must normally be assumed that the optimized event blocks $EBA_O'$ satisfy these conditions (branch "y" of step 6.VI). Then in step 6.VII the optimized waveform will be forwarded to the scanner, i.e. the event block $EBA_O$ will be transferred. This already corresponds to method step V in FIG. 2.

The optimized event block $EBA_O'$ (or in individual cases the unoptimized event block $EBA_O'$) is then transferred to the pulse transmitting arrangement 19 in step V in FIG. 2 (corresponding to step 6.VII in FIG. 6) and emitted as an output, wherein the pulse transmitting arrangement 19 ensures that the unoptimized event blocks $EBA_F$ are also emitted as an output in the appropriate sequence. For this purpose, the individual optimized event blocks $EBA_O'$ or optimizable event blocks $EBA_O$ and the unoptimizable event blocks $EBA_F$ are transferred to the pulse transmitting arrangement 19 in the appropriate sequence. For example, the unoptimizable event blocks $EBA_F$ can be delayed in a delay step IVd so that they are not transferred until the appropriate time.

Step IVa can also be explained in terms of the pulse sequence S initially being subdivided into two categories in respect of its time characteristic, i.e. into the optimizable event blocks and the unoptimizable event blocks. For example, if a radio-frequency pulse or a readout window is present, the associated time interval is assigned to a category 0="unoptimizable", whereas the intervening intervals of the pulse sequence S, without such radio-frequency pulses or readout windows, are assigned to the category 1="optimizable". This then produces time intervals (the optimizable and unoptimizable event blocks) $[0,t_1]$, $[t_1,t_2]$, $[t_2,t_3]$, etc. with alternating categories 0 and 1. The time intervals of category 1 are then optimized in the known manner e.g. by the piecewise linear function spline interpolation method. The calculated gradient waveform then replaces the original waveform of all the pulses in that interval, so that the moment of the gradient waveform and therefore the effect on the spin phase are constant.

The above described example demonstrates how the method according to the invention can be effectively used to very quickly optimize each pulse sequence in respect of noise and loading of the gradient coils immediately before it is output even for real-time applications, without any modification of the timing being necessary and consequently without any accompanying change in image quality.

It should be noted once more that the above described detailed methods and setups are exemplary embodiments and that the basic principle can also be widely varied by those skilled in the art without departing from the scope of the invention. In particular, the method according to the invention is applicable to any pulse sequences.

We claim as our invention:

1. An apparatus for providing a magnetic resonance (MR) scanner of an MR system with a final pulse sequence for operation of said MR scanner, said apparatus comprising: an input interface that receives an unoptimized pulse sequence, said unoptimized pulse sequence comprising a plurality of unoptimized event blocks that each contain a gradient pulse; an output interface that interfaces with said MR scanner, configured to compile said final pulse sequence in a form that is ready to transmit to said MR scanner; an optimization computer configured, when provided with one of said unoptimized event blocks as an input to said optimization computer, to apply a spline-based optimization algorithm to that unoptimized event block, in order to optimize a modifiable time interval associated with the gradient pulse in that unoptimized event block by using a predetermined gradient grid density; a checking computer configured to check, for each of said unoptimized event blocks, whether an optimization time, resulting from a calculation time for applying said spline-based optimization algorithm to that unoptimized event block in said optimization computer, plus an associated implementation time, exceeds a real time resulting from said time interval plus a buffer time; a reduction computer, in communication with said checking computer, configured to reduce said predetermined grid density by a factor f so as to produce a reduced gradient grid density, when said checking computer determines that said optimization time exceeds said real time, and to provide said reduced gradient grid density to said checking computer; said checking computer, upon receiving said reduced gradient grid density, being configured to check whether said optimization time with said reduced gradient grid density still exceeds said real time; said checking computer being configured, when said optimization time with said reduced gradient grid density still exceeds said real time, to forward that unoptimized event block to said output interface for inclusion in said final pulse sequence compiled by said output interface, and to otherwise forward that unoptimized event block to said optimization computer; and said optimization computer being configured to produce an optimized event block by applying said spline-based optimization algorithm to that unoptimized event block forwarded by said checking computer, and to forward the optimized event block to said output interface for inclusion in said final pulse sequence compiled by said output interface.

2. An apparatus as claimed in claim 1 wherein said reduction computer is configured to reduce said gradient grid density by said factor f dependent on a predetermined minimum gradient grid density.

3. An apparatus as claimed in claim 2 wherein said checking computer is configured to emit a scan abort signal, as said output, if said evaluation shows that said optimization time, using said predetermined minimum gradient grid density, still exceeds said real time.

4. An apparatus as claimed in claim 1 wherein said reduction computer is configured to linearly interpolate said gradient pulse in that unoptimized event block in order to produce said factor f.

5. An apparatus as claimed in claim 1 wherein said reduction computer is configured to non-linearly interpolate said gradient pulse in that unoptimized event block in order to produce said factor f.

6. A method for providing a magnetic resonance (MR) scanner of an MR system with a final pulse sequence for operating said MR scanner, said method comprising: via an input interface, receiving an unoptimized pulse sequence, said unoptimized pulse sequence comprising a plurality of unoptimized event blocks that each contain a gradient pulse; via an output interface that interfaces with said MR scanner, compiling said final pulse sequence in a form that is ready to transmit to said MR scanner; in an optimization computer configured, when the optimization computer is provided with one of said unoptimized event blocks as an input to said optimization computer, applying a spline-based optimization algorithm to that unoptimized event block, in order to optimize a modifiable time interval associated with the gradient pulse in that unoptimized event block by using a predetermined gradient grid density; in a checking computer, checking, for each of said unoptimized event blocks, whether an optimization time, resulting from a calculation time for applying said spline-based optimization algorithm to that unoptimized event block in said optimization computer, plus an associated implementation time, exceeds a real time resulting from said time interval plus a buffer time; in a reduction computer in communication with said checking computer, reducing said predetermined grid density by a factor f so as to produce a reduced gradient grid density, when said checking computer determines that said optimization time exceeds said real time, and to provide said reduced gradient grid density to said checking computer; in said checking computer, upon receiving said reduced gradient grid density, checking whether said optimization time with said reduced gradient grid density still exceeds said real time; from said checking computer, when said optimization time with said reduced gradient grid density still exceeds said real time, forwarding that unoptimized event block to said output interface for inclusion in said final pulse sequence compiled by said output interface, and otherwise forwarding that unoptimized event block to said optimization computer; and in said optimization computer, producing an optimized event block by applying said spline-based optimization algorithm to that unoptimized event block forwarded by said checking computer, and forwarding the optimized event block to said output interface for inclusion in said final pulse sequence compiled by said output interface.

7. A method as claimed in claim 6 comprising, from said reduction computer, reducing said gradient grid density by said factor f dependent on a predetermined minimum gradient grid density.

8. A method as claimed in claim 7 comprising, from said checking computer, emitting a scan abort signal, as said output, if said evaluation shows that said optimization time, using said predetermined minimum gradient grid density, still exceeds said real time.

9. A method as claimed in claim 6 comprising, in said reduction computer, linearly interpolating said gradient pulse in that unoptimized event block in order to produce said factor f.

10. A method as claimed in claim 6 comprising, in said reduction computer, non-linearly interpolating said gradient pulse in that unoptimized event block in order to produce said factor f.

11. A magnetic resonance (MR) system comprising: an MR scanner that is operable according to a final pulse sequence provided thereto; an input interface that receives an unoptimized pulse sequence, said unoptimized pulse sequence comprising a plurality of unoptimized event blocks that each contain a gradient pulse; an output interface that interfaces with said MR scanner, configured to compile said final pulse sequence and to transmit said final pulse sequence to said MR scanner; an optimization computer configured, when provided with one of said unoptimized event blocks as an input to said optimization computer, to apply a spline-based optimization algorithm to that unoptimized event block, in order to optimize a modifiable time interval associated with the gradient pulse in that unoptimized event block by using a predetermined gradient grid density; a checking computer configured to check, for each of said unoptimized event blocks, whether an optimization time, resulting from a calculation time for applying said spline-based optimization algorithm to that unoptimized event block in said optimization computer, plus an associated implementation time, exceeds a real time resulting from said time interval plus a buffer Lime; a reduction computer, in communication with said checking computer, configured to reduce said predetermined grid density by a factor f so as to produce a reduced gradient grid density, when said checking computer determines that said optimization time exceeds said real time, and to provide said reduced gradient grid density to said checking computer; said checking computer, upon receiving said reduced gradient grid density, being configured to check whether said optimization time with said reduced gradient grid density still exceeds said real time; said checking computer being configured, when said optimization time with said reduced gradient grid density still exceeds said real time, to forward that unoptimized event block to said output interface for inclusion in said final pulse sequence compiled by said output interface, and to otherwise forward that unoptimized event block to said optimization computer; and said optimization computer being configured to produce an optimized event block by applying said spline-based optimization algorithm to that unoptimized event block forwarded by said checking computer, and to forward the optimized event block to said output interface for inclusion in said final pulse sequence compiled by said output interface, and to thereby operate said MR scanner with said final pulse sequence compiled by said output interface.

12. A non-transitory, computer-readable data storage medium encoded with programming instructions, said storage medium being distributively loaded into a computer system of an magnetic resonance (MR) system that comprises an MR scanner that is operable according to a final pulse sequence, said programming instructions causing said computer system to: via an input interface, receive an unoptimized pulse sequence, said unoptimized pulse sequence comprising a plurality of unoptimized event blocks that each contain a gradient pulse; via an output interface that interfaces with said MR scanner, compile said final pulse sequence in a form that is ready to transmit to said MR scanner; in an optimization computer of said computer system, when said optimization computer is provided with one of said unoptimized event blocks as an input to said optimization computer, apply a spline-based optimization algorithm to that unoptimized event block, in order to optimize a modifiable time interval associated with the gradient pulse in that unoptimized event block by using a predetermined gradient grid density; in a checking computer of said computer system, checking, for each of said unoptimized event blocks, whether an optimization time, resulting from a calculation time for applying said spline-based optimization algorithm to that unoptimized event block in said optimization computer, plus an associated implementation time, exceeds a real time resulting from said time interval plus a buffer time; in a reduction computer of said computer system, in communication with said checking computer, reduce said predetermined grid density by a factor f so as to produce a reduced gradient grid density, when said checking computer determines that said optimization time exceeds said real time, and to provide said reduced gradient grid density to said checking computer; in said checking computer, upon receiving said reduced gradient grid density, check whether said optimization time with said reduced gradient grid density still exceeds said real time; from said checking computer, when said optimization time with said reduced gradient grid density still exceeds said real time, forward that unoptimized event block to said output interface for inclusion in said final pulse sequence compiled by said output interface, and otherwise forward that unoptimized event block to said optimization computer; and in said optimization computer, produce an optimized event block by applying said spline-based optimization algorithm to that unoptimized event block forwarded by said checking computer, and forward the optimized event block to said output interface for inclusion in said final pulse sequence compiled by said output interface.

\* \* \* \* \*